United States Patent [19]
Macias

[11] Patent Number: 6,000,890
[45] Date of Patent: Dec. 14, 1999

[54] RETRACTABLE SELF-LOCKING CLEAT FOR ROPE, CABLE AND THE LIKE

[76] Inventor: Israel A. Macias, 325 Springpark Circle, San Jose, Calif. 95136

[21] Appl. No.: 09/311,677

[22] Filed: May 12, 1999

Related U.S. Application Data

[60] Provisional application No. 60/085,167, May 12, 1998.

[51] Int. Cl.⁶ .................................................. F16G 11/00
[52] U.S. Cl. .................. 410/116; 24/134 R; 410/106; 410/110; 410/111
[58] Field of Search ................... 24/132 R, 134 R, 24/265 LD, 115 K, 134 L, 134 KB; 114/218; 410/101, 106, 107, 110, 111, 116, 73

[56] References Cited

U.S. PATENT DOCUMENTS

| | | |
|---|---|---|
| 3,556,457 | 1/1971 | Patnaude . |
| 4,820,093 | 4/1989 | Hirakui et al. ........................ 410/107 |
| 4,883,208 | 11/1989 | Bott ................................... 410/111 X |
| 4,903,876 | 2/1990 | Bott ................................... 410/107 X |
| 5,548,873 | 8/1996 | Macias ................................. 24/134 R |

Primary Examiner—James R. Brittain
Attorney, Agent, or Firm—Claude A.S. Hamrick; Oppenheimer Wolff & Donnelly

[57] ABSTRACT

A retractable self-locking cleat for rope, cable and like including means forming a base that can be mounted to a truck body, deck or other surfaces which includes an opening, recess, well or cavity into which an improved self-locking cleat component can be retracted. The cleat component is pivotably secured to the base and can be rotated into and out of the recess. The pivotable connection between the self-locking cleat component and the base may include a pivot pin and slot configuration that permits the cleat component to be maintained in its extended position once rotated thereinto or until it is repositioned so that it can be pivoted into its retracted position. Suitable bolts or other fasteners may be used to secure the base to the apertured wall, deck or other surface. In an alternative embodiment, the base is formed into a classical, fixed cleat configuration having a cavity formed in its midsection for receiving a retractable self-locking cleat component pivotably attached to the fixed base.

7 Claims, 5 Drawing Sheets

PUSH TO LOCK

RETRACTABLE SELF-LOCKING CLEAT FOR ROPE, CABLE AND THE LIKE

REFERENCED TO PRIOR APPLICATION

This application claims the benefit of U.S. Provisional Application No. 60/085,167, filed May 12, 1998, and entitled "Retractable Self-Locking Cleat for Rope, Cable and the Like."

BACKGROUND OF THE INVENTION

1. Field of the Invention

The present invention relates generally to rope or cable cleats, and more particularly to an improved cleat structure including a base member housing on opening/cavity formed therein, and a housing for a rotatable cam-type locking member for selectively locking and releasing a rope or cable drawn through a passageway formed through the housing, the housing being pivotably attached to the base member and movable between an extended position and a retracted position nested within the opening/cavity.

2. Description of the Prior Art

As is disclosed in my prior U.S. Pat. No. 5,548,873 entitled "Self-Locking Cleat For Rope, Cable and the Like" which is expressly incorporated herein by reference, and as generally illustrated in FIGS. 1 and 2 of the present drawing, my prior art cleating device is comprised of a base 10 having an elongated mounting flange with fastener receiving openings 12 and 14 provided at respective ends thereof. The upper portion 16 is, as best illustrated in FIG. 2 of the drawing, configured to include a cavity 18 positioned between front and rear upstanding walls 20 and 22, the latter having a slot 24 formed therein. In the middle of the base is a transversely extending semi-cylindrical surface 26 forming one-half of the rope receiving opening 28 shown in FIG. 1. On the rightmost side, as illustrated, is an upstanding member 30 having a vertically extending bore 32 formed therein for receiving a fasting screw or bolt 34. Disposed within and extending out of either side of the cavity 18 is a rotatable cam 36 having a serrated, ridged or otherwise roughened surface 38, and an extended lever arm 40. The cam 36 includes a bore 42 for receiving a pivot and fastening bolt 44 that is extended up through an opening (not shown) in the base 10 and passes through a first coil spring 46, the bore 42 and a second coil spring 48. Opposite ends of the springs bear against the cam 36 and walls 20, 22 respectively, to resiliently bias the cam into its rope engaging position. A cover plate 50 is configured to mate with the base 10 and includes a transversely extending slot 52 and a downwardly facing transversely extending semi-cylindrical surface 54 that mates with the upwardly facing cylindrical surface 26 to form a cylindrical passageway into which the cam 36 extends and through which a rope or cable may be passed. After being positioned over the cam assembly and in place against the base 10, the cover 50 is secured in place by means of the screw, or bolts, 34 and 44 which thread into downwardly facing threaded bores (not shown) formed in the bottom surface of the cover plate.

As is best illustrated in the assembled showing of FIG. 1, by pulling the lever arm 40 toward the viewer so that it moves through the slot 52 and into the slot 24, the cam 36 will be rotated about the pivot bolt 44 (FIG. 2) so as to clear the passageway formed by surfaces 26 and 54 allowing a rope (or cable) or the like to be threaded therethrough. Upon subsequent release of the lever 40, the springs 46 and 48 (FIG. 2) will cause the cam 36 to be urged into engagement with the rope (or cable) such that an attempted retraction will cause frictional engagement between the roughened surface 38 and the rope, and will clampingly secure the rope within the passageway and prevent its removal until lever 40 is forced forward to rotate the cam out of engagement with the rope and allow it to be withdrawn from the passageway. Note however, that the rope may be pulled in the opposite direction, i.e., the direction of its tail, so as to tighten the rope (relative to its opposite end).

Although this prior art device has met with success in the industry, and has been successfully used for a number of applications, its upstanding nature and configuration provides somewhat of an obstacle when not in use. There is thus a need for a device of this type which can be extended from a suitable housing when in use, but can be retracted into the housing during periods of non-use.

SUMMARY OF THE INVENTION

It is therefore an object of the of the present invention to provide a novel retractable self-locking cleat device that is extendible for use but retractable when not in use.

Another object of the present invention is to provide a device of the type described which can be mounted within an opening formed in a truck wall, stake hole, or the like, such device being extendible for use and retractable when not in use.

Yet another object of the present invention is to provide a device of the type described having an external configuration that forms a standard tie-down cleat with a cavity formed therein and which includes a self-locking cleat of the type described that is retractable from a closed position in the cavity to an open position extended thereto.

Briefly, a presently preferred embodiment of the invention includes means forming a base that can be mounted to a truck body, deck or other surfaces which includes an opening, recess, well or cavity into which an improved self-locking cleat component can be retracted. The cleat component is pivotably secured to the base and can be rotated into and out of the recess. The pivotable connection between the self-locking cleat component and the base may include a pivot pin and slot configuration that permits the cleat component to be maintained in its extended position once rotated thereinto or until it is repositioned so that it can be pivoted into its retracted position. Suitable bolts or other fasteners may be used to secure the base to the apertured wall, deck or other surface. In an alternative embodiment, the base is formed into a classical, fixed cleat configuration having a cavity formed in its midsection for receiving a retractable self-locking cleat component pivotably attached to the fixed base.

An important advantage of the present invention is that it includes a self-locking apparatus that is normally recessed within a protective cavity or well, but which can be rotated into an extended position and used as a self-locking cleat.

Another important advantage of the present invention is that when mounted to a truck bed or side wall at a stake hole, it provides a substantially flush "cap" closing the stake hole.

Yet another advantage of the present invention is that when configured as an assembly including a fixed cleat structure in combination with an extendible self-locking cleat component, the fixed cleat structure can be used in the classical manner to provide tie offs for rope, cable or the like, and when the self-locking cleat component is rotated into its extended position, it may used either independently of the fixed cleat structure or in conjunction therewith to provide an improved tie down function.

These and other objects and advantages of the present invention will no doubt become apparent to those skilled in the art, after having read the following detailed description of a preferred embodiments illustrated in the several figures of the drawing.

IN THE DRAWING

DETAILED DESCRIPTION OF THE PREFERRED EMBODIMENTS

Figure 3:
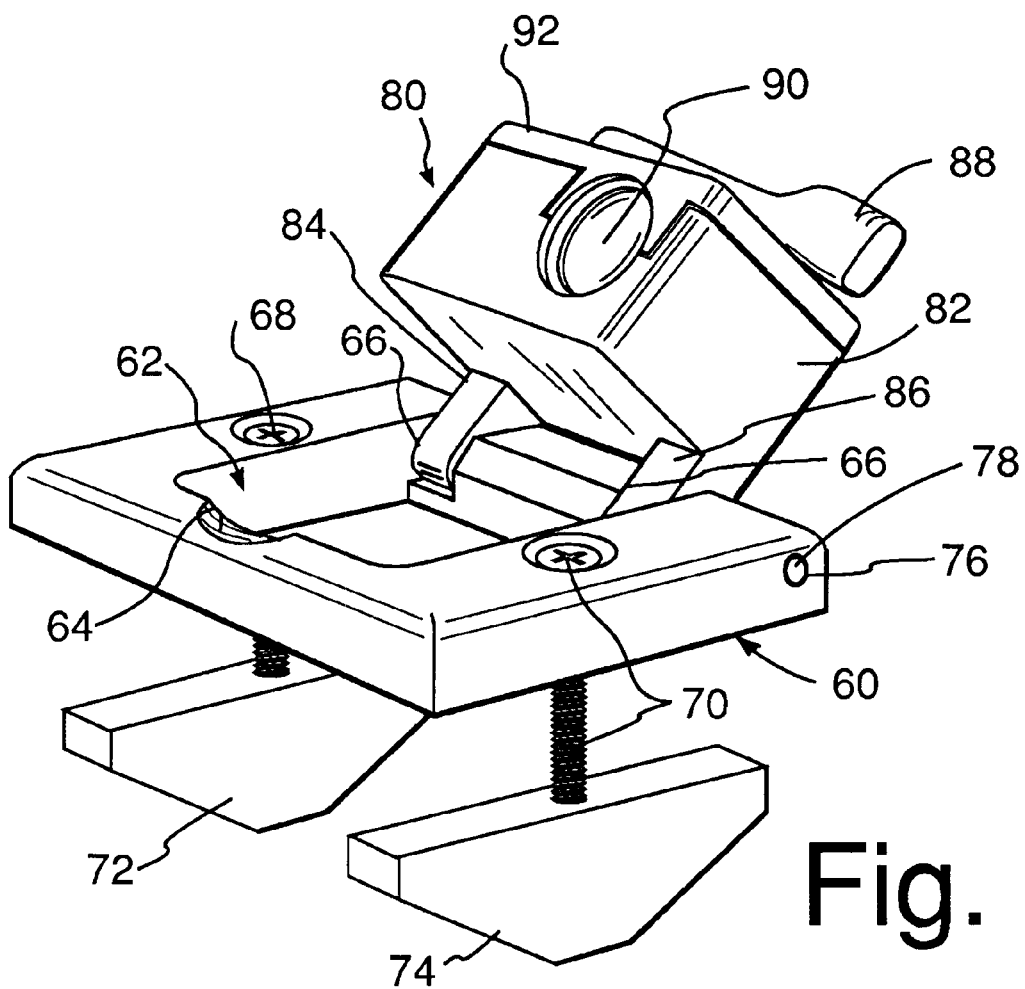
FIG. 3 is a perspective view illustrating a flush mount configuration of a retractable self-locking cleat assembly in accordance with a preferred embodiment of the present invention.

Referring now to FIG. 3 of the drawing, an embodiment of the present invention shown that is adapted to be attached to a flat surface having an opening therein, such as for example, a stake pocket or hole in the top of a side wall of a pickup truck, or a stake pocket or hole in the bed or bed side of a flat bed truck. As depicted in the perspective view, the apparatus includes a base member in the form of a plate 60 that is generally rectangular in configuration and has a generally rectangular shaped aperture or opening forming a cavity or recess 62, more or less centrally positioned relative to plate 60. On one side of the opening, a semi-circular scoop 64 is provided in the top surface of the aperture bounding wall. On the opposite side of the plate, a pair of grooves 66 extend from the central aperture to the outer perimeter of the plate. Extending down through plate 60 are a pair of counter sunk bores for respectively receiving a corresponding pair of Philips headed screws or bolts 68 and 70. Threadably attached to the distal ends of the bolts 68 and 70 are a pair of bored and threaded wingnuts or the like 72 and 74, which upon clockwise rotation of the screws 68 and 70, will be drawn upwardly toward the bottom surface of plate 60. Extending through the side of plate 60, having the grooves 66 formed therein, is a bore 76 for receiving a pivot pin 78.

Figure 1:
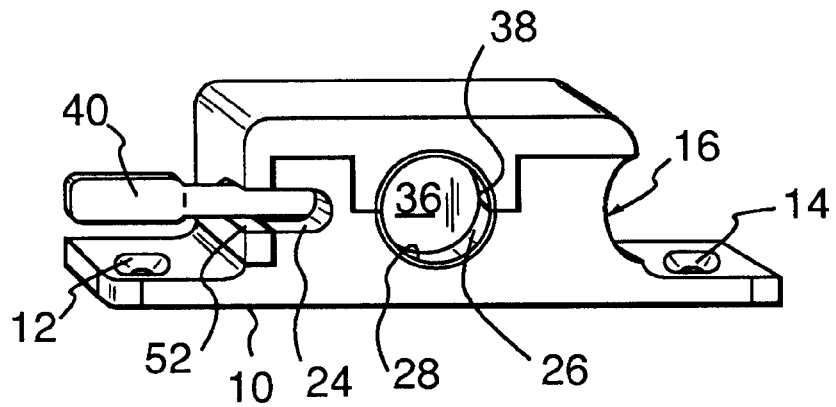
FIG. 1 is a perspective view showing a prior art self-locking apparatus.
Figure 2:
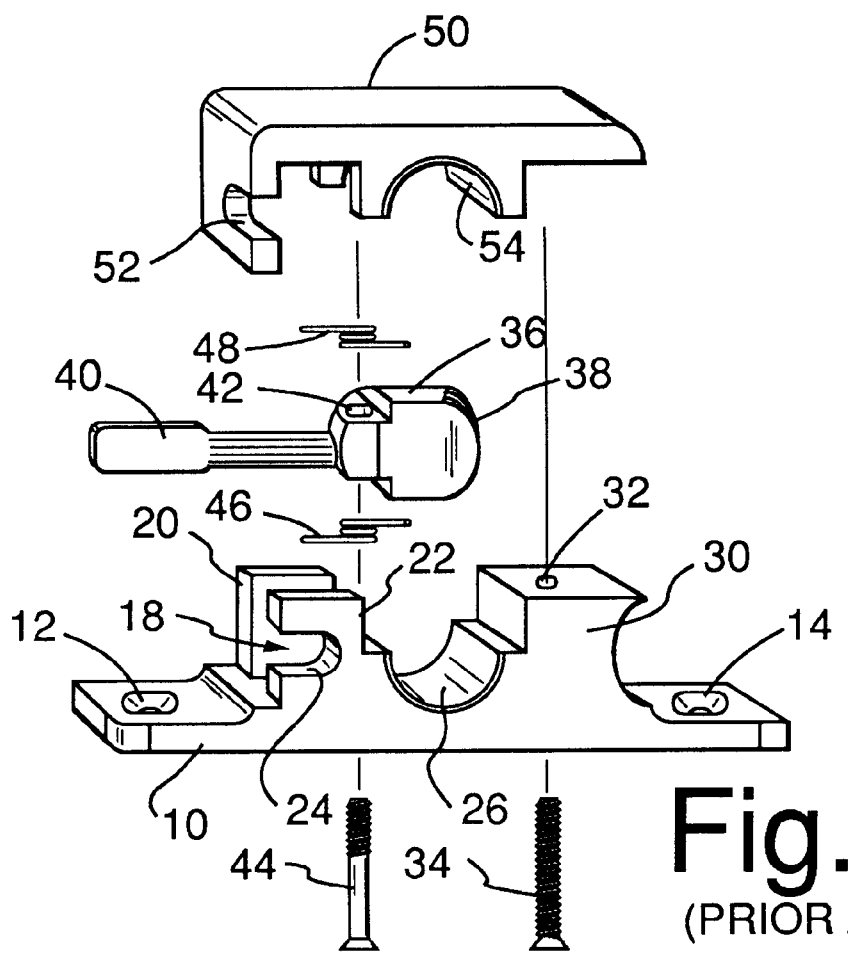
FIG. 2 is an exploded view illustrating the several components of the self-locking cleat apparatus depicted in assembled form in FIG. 1.

Pivotally mounted to plate 60 by means of pin 78, is a self-locking cleat assembly 80 similar to that depicted in FIGS. 1 and 2, except that instead of having an extended base plate 10 (FIG. 1), the lower housing component 82 includes a pair of downwardly depending legs 84 and 86 having dimensions and other characteristics suitable for receipt within the grooves 66, and having apertures formed therein (not shown) for receiving the pivot pin 78. The assembly 80 is internally configured substantially similar to that depicted in FIGS. 1 and 2 except that in place of the lever arm 40 (FIG. 1), an external lever 88 is pivotally coupled to the camming member 90 by means of a short coupling shaft (not shown) that passes through the upper housing component 92. As will be appreciated from the following discussion, the self-locking cleat component 80 may be rotated about the pivot pin 78 from its extended position illustrated in FIG. 3, to a retracted position nested within the opening 62 as depicted in the plan view of FIG. 4.

Figure 4:
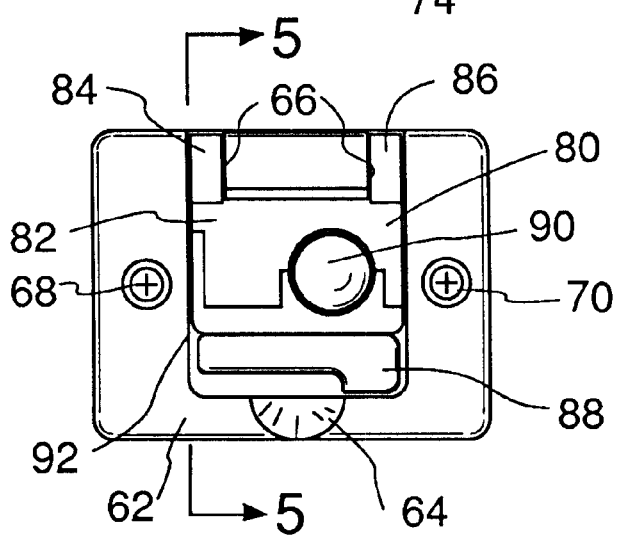
FIG. 4 is a plan view of the assembly illustrated in FIG. 3.
Figure 5:
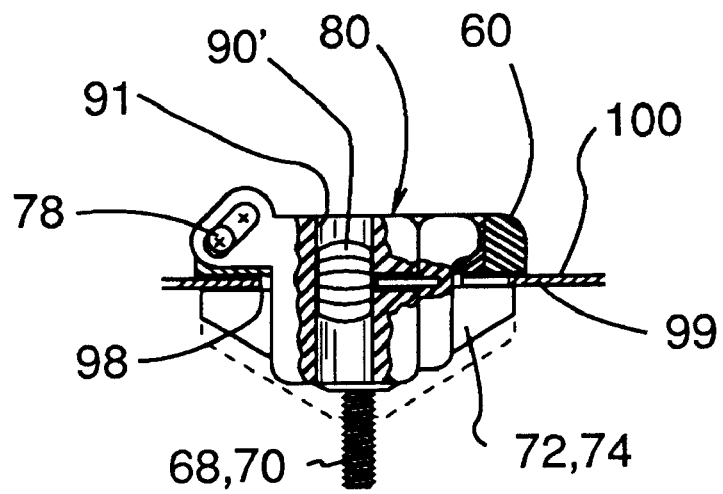
FIGS. 5–7 are respectively cross-sections taken along the line 5—5 in FIG. 4 illustrating operation of the embodiment of FIG. 3.
Figure 6:
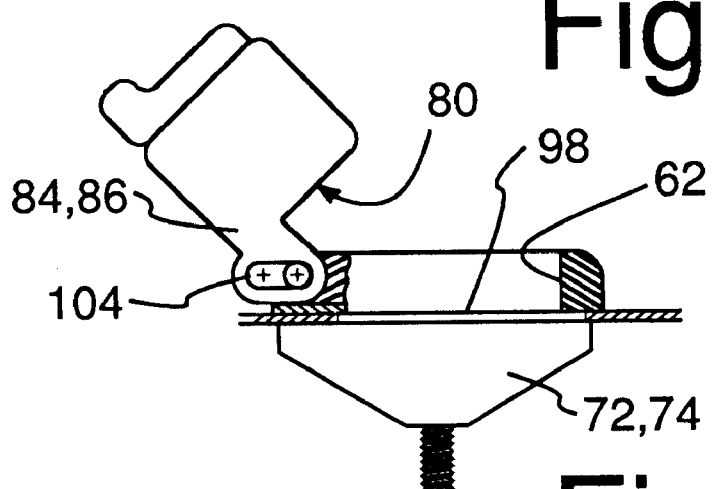
Figure 7:
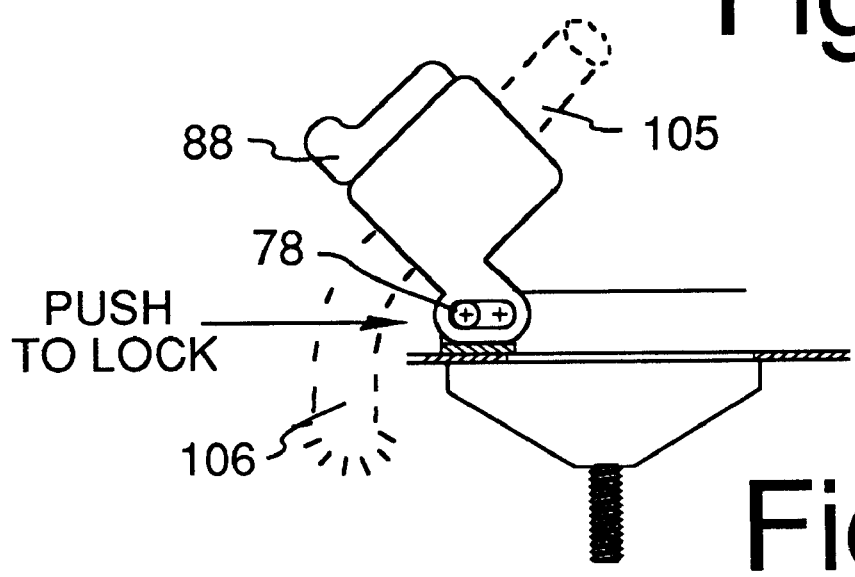
Figure 8:
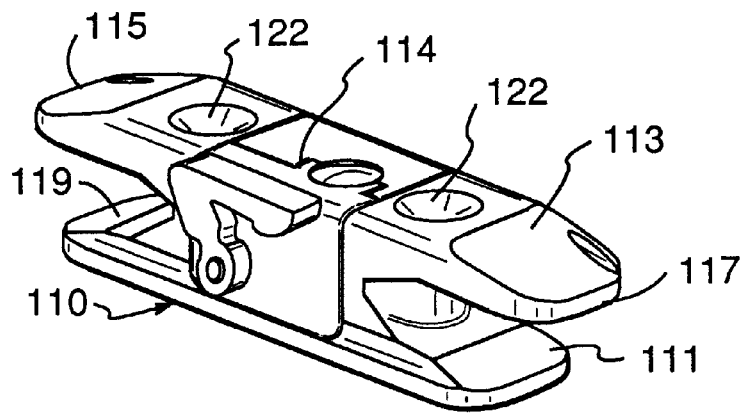
FIG. 8 is a perspective view of an alternative embodiment of the present invention configured in the form of a classical fixed cleat but having a retractable self-locking cleat apparatus in combination therewith in accordance with the present invention.
Figure 9:
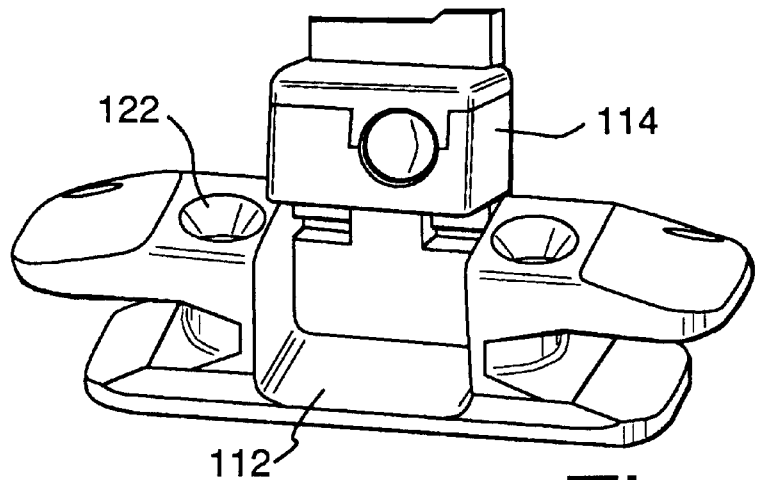
FIG. 9 is a perspective view of the embodiment of FIG. 8 showing the self-locking cleat apparatus rotated into an upright position.

Referring now to FIGS. 5, 6 and 7 which are simplified cross-sections taken along the line 5—5 in FIG. 4, mounting of the assembly to a stake pocket or other opening 98 in a panel 99 forming a surface 100 together with rotation of the self-locking cleat component between its retracted and extended positions will be discussed. In FIG. 5, the assembly is shown with the clear component rotated into its retracted position nested within the opening of plate 60, disposed in mating relationship with the a stake hole or pocket 102 formed in a sheet metal panel 99 or the like. Note that plate 60 lies upon the surface 100 and the cleat component 80 extends through opening 98 as well as the opening 62 in plate 60. Also extending into the opening 98 are the bolts 68, 70 which threadably engage the wingnuts 72, 74.

In this embodiment, prior to insertion into the stake pocket, the bolts or screws 68, 70 would be rotated counter-clockwise to lower the wingnuts 72–74 so that they can be easily inserted into the pocket. The bolts (screws) would then be rotated counter-clockwise to draw the wingnuts 72, 74 into engagement with the bottom surface of the panel 99 as depicted by the solid lines. When the screws are tightened, assembly is complete, and the cleat component 80 can be rotated about pivot pin 78 from its nested position into the open position shown in FIG. 6. Note that the pivot openings 104 provided in the legs 84 and 86 may be elongated as illustrated so that once rotated into the fully extended position shown, the component can be pushed inwardly relative to plate 60 so as to lock the deployed cleat in position. The locking action is caused by the engagement of the extremities of legs 84, 86 with the upper surface of the bottom of the slots 66 formed in plate 60 as depicted in FIG. 7.

At this point, lever 88 can be depressed to rotate camming member 90 out of the passageway 91 (FIG. 5), and a rope or cable 105 can be pressed therethrough as suggested by the dashed lines in FIG. 7. Once so positioned, lever 88 can be released and the internal springs will bias it into locking engagement with the rope such that any force tending to extricate the rope will be met with locking engagement between the camming member 90 and the rope, thereby preventing its removal. On the other hand, pulling on the rope tail 106 will tend to disengage the frictional locking engagement and allow greater tension to be drawn in the rope or cable.

Upon completion of its need, lever 80 can be depressed allowing the rope 105 to be withdrawn from the passageway 91, the cleat assembly can be pushed outwardly to disengage the pivot lock, and the assembly can be rotated about pin 78 back into its nested position within the opening of plate 60 and extending into the stake pocket about which it is mounted. Although the embodiment depicted in FIGS. 5–7 illustrates a slotted pivot aperture 104, it will be appreciated that a simple bore may alternatively be provided such that the cleat assembly 80 is merely rotatable between an extended position and a retracted position, and is free to seek its own operational position dependent upon the direction of pull of the rope it is used to secure.

Turning now to FIGS. 8–11, an alternative embodiment of the present invention is depicted wherein instead of having the cleat assembly mounted to an apertured plate and adapted to engage a stake pocket or other opening, the rotatable cleat assembly is pivotally attached to a specially configured fixed cleat structure 110 having a recess 112 (See FIGS. 9 and 10) formed in a central part thereof for receiving the self-locking cleat assembly 114. The assembly is shown in its retracted position in FIG. 8, an intermediate extended position shown in FIG. 9, and a fully extended or reclined position depicted in FIG. 10. The fixed cleat 110 is comprised of a base portion 111, a top portion 113 having oppositely extending cantilevered arms 115 and 117, and a central portion 119 found integral with and joining the top and base portions. As will be appreciated by those skilled in the art, the structure depicted in FIG. 8 closely resembles the familiar cleat device formed on many boat decks and docks, such cleats being used to secure boats to the dock. However, as further illustrated in FIGS. 9 and 10, it will be noted that the illustrated apparatus differs substantially from any other known cleat device even though it appears physically similar and is affixed to a surface using screws passed through the counter-bored holes 122 as are prior art fixed cleats.

Figure 10:
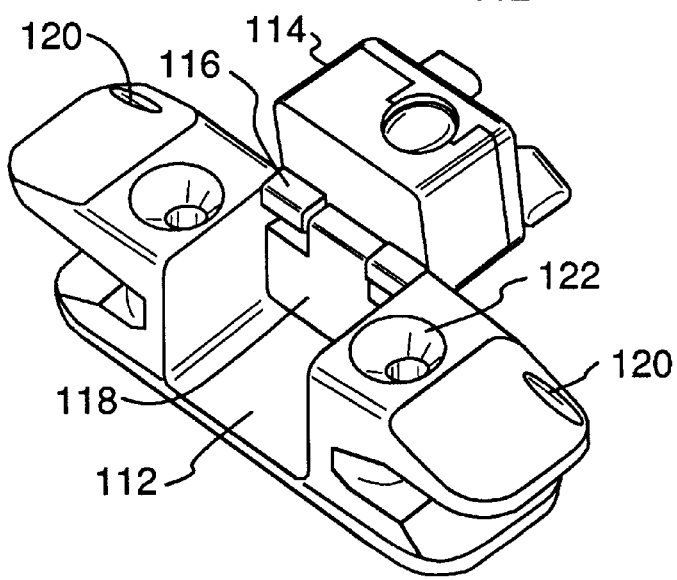
FIG. 10 is a perspective view of the embodiment of FIG. 8 showing the self-locking cleat apparatus rotated into a reclined position.

As best viewed in FIG. 10, the legs 116 depending from the body 114 are disposed within notches, or grooves, cut in a rear wall 118 and are pivotally secured to the somewhat anvil-shaped cleat 110 by means of a pivot pin (not shown) extended through a bore 120 which is open at both ends of the fixed cleat. The pivot pin is pressure fit into the bore 120. This permits the self-locking cleat 114 to be rotated from its retracted position (FIG. 8) to its extending positions shown in FIGS. 9 and 10.

Figure 11:
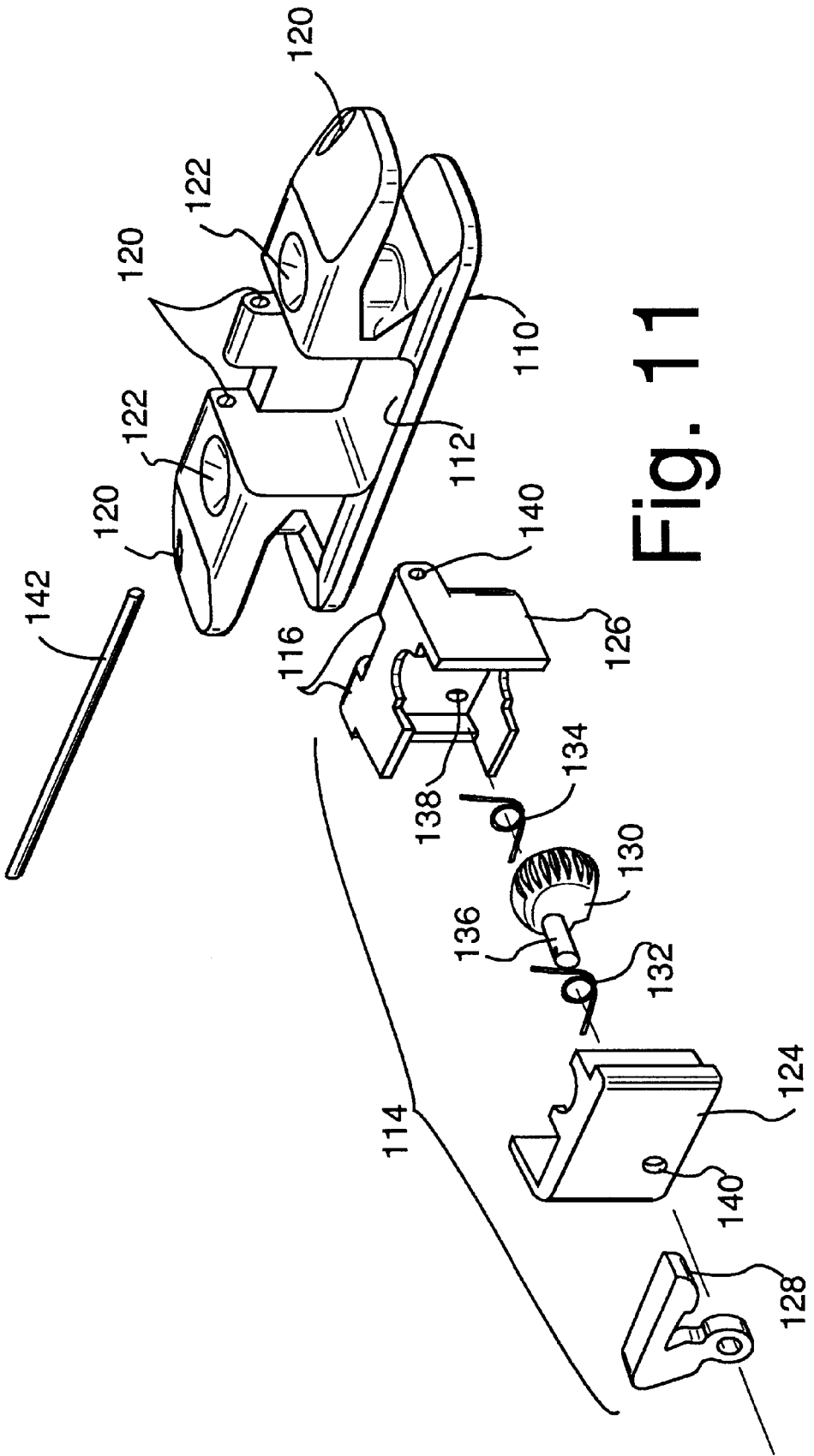
FIG. 11 is an exploded perspective view illustrating the several component parts of the alternative embodiment depicted in FIGS. 8–10.

In FIG. 11, an exploded view showing the various components of this alternative embodiment is provided. As previously shown, the apparatus includes the generally anvil-shaped fixed cleat body 110 that may be secured to a flat surface by means of screws inserted through the counter-bored openings 122 provided on opposite sides of the cavity 112. The self-locking cleat component 114 is comprised of a pair of mating housing members 124 and 126, a cam release lever 128, and a cam 130 along with springs 132 and 134. Cam 132 is mounted to a short shaft 136 that extends through the springs 132 and 134, and on one side extends into a pocket 138 formed in member 126, and on the other side, extends through an opening 140 in member 124 where it is mated with a bore formed in lever 128 and pinned thereto by means not shown. Also not shown are the screws or bolts used to hold housing components 124 and 126 together. Such details can be found in FIGS. 1 and 2. Note that the legs 116 of housing member 126 have bores 140 through which the pin 142 is extended when the assembly 114 is positioned within cavity 112 and the bores 140 are aligned with the bore 120 passing longitudinally through one side of the base 110. Pin 142 is press fit into the bore and through the bores 140 to pivotally secure the parts together. The preferred embodiments are CNC machined from aircraft quality 6061-T6 aluminum and corrosion resistant stainless steel and are hand assembled for precision operation. However, one or more of the parts could alternatively be made of inspection molded carbon/graphite, filled nylon, or other materials. Moreover, various parts could be made of sintered metals and ceramic materials.

What I claim is:

1. A retractable self-locking cleat apparatus comprising:

a base member having a cavity formed therein;

a self-locking cleat assembly having a passageway through which a rope/cable may be drawn, a spring-loaded releasable cam for engaging the rope/cable and preventing its withdrawal from the passageway, and a lever means coupled to said cam for selectively rotating said cam out of engagement with said rope/cable, thereby enabling said rope/cable to be withdrawn from said passageway; and pivot means pivotally securing said cleat assembly to said base member such that said cleat assembly may be rotated between a retracted position nested within said cavity and an extended position outside said cavity.

2. A retractable self-locking cleat apparatus as recited in claim 1 wherein said base member includes a plate having an opening therein forming said cavity, said cleat assembly extending through said opening when in said retracted position.

3. A retractable self-locking cleat apparatus as recited in claim 2 wherein said cleat assembly includes a housing having at least one leg extending therefrom, and wherein said plate has at least one groove formed therein adjacent said opening for receiving said leg, said leg being pivotally secured to said plate by a pivot pin.

4. A retractable self-locking cleat apparatus as recited in claim 1 wherein said base member includes a base portion and an upper portion including a pair of oppositely extending cantilevered members joined to said base member by a connecting portions, said connecting portion having said cavity formed therein, whereby said fixed cleat may be used to secure a rope/cable, the end of which may be passed through said passageway in said self-locking cleat assembly.

5. A retractable self-locking cleat apparatus as recited in claim 4 wherein means are provided for securing said fixed cleat to a surface.

6. A retractable self-locking cleat apparatus as recited in claim 4 wherein said base portion, said upper portion and said connecting portion are integrally formed as a unit.

7. A retractable self-locking cleat apparatus as recited in claim 1 wherein at least one spring is provided to bias said cam toward said passageway.

* * * * *